United States Patent [19]

Kitazawa et al.

[11] Patent Number: 5,051,953
[45] Date of Patent: Sep. 24, 1991

[54] EEPROM DEVICE INCLUDING READ, WRITE, AND ERASE VOLTAGE SWITCHING CIRCUITS

[75] Inventors: Shooji Kitazawa; Takashi Ono, both of Tokyo, Japan

[73] Assignee: Oki Electric Industry Co., Ltd., Tokyo, Japan

[21] Appl. No.: 453,073

[22] Filed: Dec. 18, 1989

Related U.S. Application Data

[63] Continuation of Ser. No. 205,093, Jun. 10, 1988, abandoned.

[30] Foreign Application Priority Data

Jun. 11, 1987 [JP] Japan ................ 62-144033

[51] Int. Cl.$^5$ ........................................ G11C 16/06
[52] U.S. Cl. ............................ 365/185; 365/189.09; 365/218; 365/230.06
[58] Field of Search .......... 365/104, 184, 185, 189.09, 365/218, 230.06

[56] References Cited

U.S. PATENT DOCUMENTS

| | | | |
|---|---|---|---|
| 4,387,447 | 6/1983 | Klaas et al. | 365/230 |
| 4,425,632 | 1/1984 | Iwahashi et al. | 365/185 |
| 4,437,172 | 3/1984 | Masuoka | 365/185 |
| 4,437,174 | 3/1984 | Masuoka | 365/185 |
| 4,698,787 | 10/1987 | Mukherjee et al. | 365/104 |

FOREIGN PATENT DOCUMENTS

| | | |
|---|---|---|
| 0083194 | 7/1983 | European Pat. Off. ............ 365/185 |
| 61-6475 | 2/1986 | Japan . |
| 61-20958 | 5/1986 | Japan . |
| 61-30351 | 7/1986 | Japan . |
| 61-30354 | 7/1986 | Japan . |
| 61-165895 | 7/1986 | Japan . |

OTHER PUBLICATIONS

Physics of Semiconductor Devices, Second Edition; S. M. Sze; Bell Laboratories, Incorporated; Murray Hill, New Jersey; pp. 88 and 99.
1987 IEEE International Solid-State Circuits Conference, Digest of Technical Papers, "Nonvolatile Memory"; pp. 76, 77 and 345; Samachisa et al, Feb. 25, 1987.

*Primary Examiner*—Glenn Gossage
*Attorney, Agent, or Firm*—Wenderoth, Lind & Ponack

[57] ABSTRACT

An electrically erasable nonvolatile semiconductor device of a high density of integration includes a memory matrix array formed of a plurality of MOS memory transistors. In an erasing operation, a voltage to turn off one selected MOS memory transistor is applied to the control gate electrode of the selected MOS memory transistor. At the same time, a voltage near the breakdown voltage of the selected MOS memory transistor is applied to the first electrode (e.g.—source electrode) of the selected MOS memory transistor and a predetermined voltage is applied to the second electrode (e.g.—drain electrode) of the same MOS memory transistor.

7 Claims, 9 Drawing Sheets

EEPROM DEVICE INCLUDING READ, WRITE, AND ERASE VOLTAGE SWITCHING CIRCUITS

This application is a continuation of now abandoned application Ser. No. 07/205,093, filed on June 10, 1988.

BACKGROUND OF THE INVENTION

1. Field of the Invention

The present invention relates to a semiconductor device, and more particularly, to an electrically erasable nonvolatile semiconductor device.

2. Description of the Prior Art

There have been proposed various electrical methods to erase data written in a nonvolatile semiconductor read-only memory.

For example, data can be electrically restored in the EEPROM (electrically erasable programmable read-only memory) by using electrons which pass through a thin insulating layer due to the tunneling effect.

However, since the EEROM requires two MOS transistors form a single memory cell, the EEPROM is inferior in its density of integration with respect to an EPROM (erasable programmable read-only memory) in which stored data can be erased by ultraviolet light. Moreover, the EEPROM requires a high voltage on the order of 21 volts for enabling the tunneling effect, which requires a complex power circuit. To eliminate such a disadvantage, there have been proposed EEPROMs with a high density of integration employing MOS memory elements each having a floating gate as shown in FIG. 3, employed in the conventional EPROM.

Such EEPROMs are disclosed, for example, in Japanese Patent Publication Nos. 61-6475, 61-20958, 61-30351 and 61-30354, Japanese Laid-Open Patent Publication No. 61-165895, and IEEE International Solid-State Circuit Conference, Digest of Technical Papers pp. 76-77, 345 (Feb. 25, 1987).

A writing operation of the EEPROM, in a fashion similar to that of the conventional EPROM, is implemented by injecting hot electrons generated in the vicinity of the drain region into the floating gate.

The following two methods have been proposed for an erasing operation.

In the first method, a high voltage is applied to the drain region 3 of a MOS memory element as shown in FIG. 3 and the source region 4 and the control gate electrode 1 are connected to a ground to reduce the potential of a floating gate sufficiently. Consequently, electrons move from the floating gate to the electrode of a higher potential due to the tunneling effect, whereby data stored in the MOS memory element is erased. In this method, however, it is difficult to control the potential of the floating gate of the MOS memory element after the erasing operation.

A second method uses the breakdown effect at the drain region of a MOS memory element employed in the EPROM. In the erasing operation, a high voltage, a ground voltage and a negative voltage are applied respectively to the drain region 3, a p-type substrate and a control gate 1 of a MOS memory element to induce breakdown in the vicinity of the drain region. Consequently, holes having high energy are injected into the floating gate to erase data stored in the MOS memory element. However, the erasing operation requires a high current and a negative voltage which must be applied to the control gate of the MOS memory element. Since the source region and drain region of an n-type transistor cannot be biased by a negative voltage, it is necessary that a negative voltage applying means for the control gate be formed of a PMOS transistor formed in the n-type well and a load resistance of polycrystalline silicon, which requires a complex circuit construction.

These erasing methods are not applicable to E/D (enhancement/depletion) MOS EPROM ICs, which are currently the most popular type of ICs.

SUMMARY OF THE INVENTION

Accordingly, it is an object of the present invention to provide an EEPROM with a high density of integration.

It is another object of the present invention to provide an EEPROM incorporating a single MOS memory element of a floating gate type as a memory cell.

To achieve the objects of the invention, the present invention provides an EEPROM device comprising: a semiconductor substrate; a memory matrix array formed on said semiconductor substrate, comprising a plurality of MOS memory elements having a floating gate and a plurality of word lines arranged in rows and a plurality of data lines arranged in columns, each of said word lines being associated with a plurality of MOS memory elements, and each of said data lines being associated with a plurality of MOS memory elements, and each of said MOS memory elements associated with each of said word lines having a gate electrode connected to a word line, a first electrode connected to a data line and a second electrode connected to a third line; a word line decoder connected to said plurality of said word lines for selecting one of said word lines and for applying a first voltage to at least one gate electrode of said MOS memory elements associated with a selected word line for performing an erasing operation; a switching circuit connected to said data lines for providing a second voltage to a selected one of said data lines to generate an avalanche current which flows from a first electrode of a selected MOS memory element toward said substrate, thus performing an erasing operation, said second voltage being below and near to a breakdown voltage of said selected MOS memory element; a reading and writing circuit connected to said switching circuit for providing said second voltage to said switching circuit; and a means connected to said third line for providing to said second electrode a third voltage which is higher than a substrate voltage generated due to the avalanche current flowing from the first electrode of said selected MOS memory element toward said substrate so as to suppress the breakdown effect of said selected MOS memory element during an erasing operation.

The above and other objects, features and advantages of the present invention will become more apparent from the following description taken in conjunction with the accompanying drawings.

DESCRIPTION OF THE PREFERRED EMBODIMENT

An EEPROM embodying the present invention will be described hereinafter with reference to the accompanying drawings.

In the EEPROM, an erasing operation is achieved by neutralizing electric charges of the floating gate by a current which flows from the drain region to the substrate of a MOS memory element before the breakdown of the MOS memory element, and a writing operation is achieved by injecting high-energy electrons by an avalanche current of the channel region.

Figure 4:
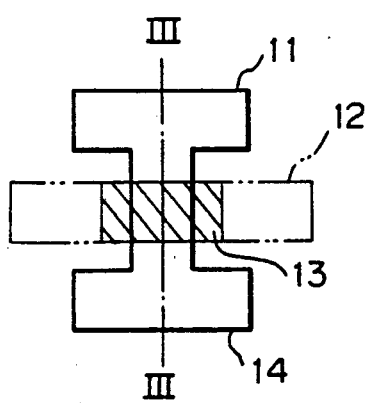
FIG. 4 is a plan view of a MOS memory element employed in the EEPROM of FIG. 1.

First, a writing operation, in which electrons are injected into the floating gate, will be described with reference to FIGS. 4 and 5.

Figure 5:
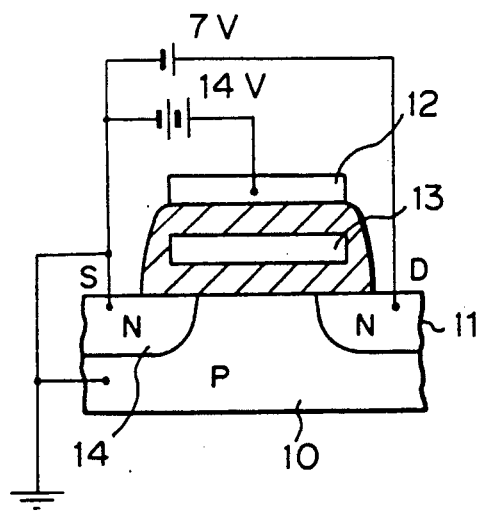
FIG. 5 is a sectional view of the MOS memory element of FIG. 4 taken on line III—III in FIG. 4.

Referring to FIG. 5, a voltage of 0 volts is applied, for example, to a p-type silicon substrate 10 and a source region 14, and 14 volts are applied between a control gate 12 and a source region 14, and 7 volts are applied between the source region 14 and a drain region 11. Thus, a high electric field is induced in a channel region near the drain region 11, whereby high-energy electrons are injected into a floating gate 13 across an energy barrier formed by an oxide film surrounding the floating gate 13. Consequently, the threshold voltage for the control gate of the MOS memory element increases. The writing voltage (drain voltage) in this writing condition is 7 volts, which is lower than a writing voltage, for example, a voltage in the range of 8 to 10 volts, for an ordinary EPROM.

Figure 6:
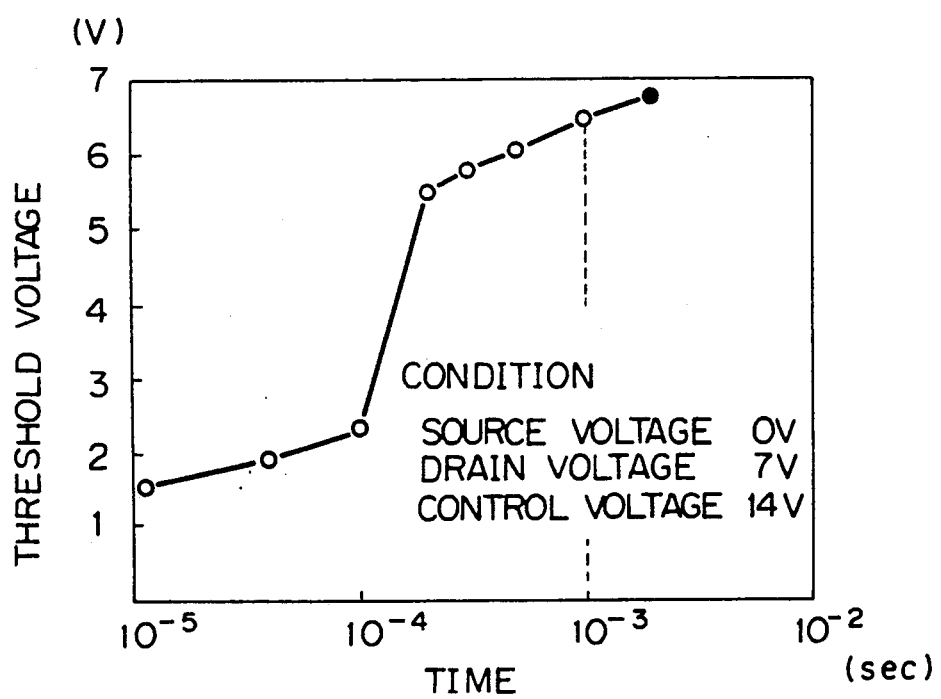
FIG. 6 is a graph showing variations in the threshold voltage with time after a writing operation of a MOS memory element.

FIG. 6 is a graph showing variations in the threshold voltage with respect to time after data has been written in the floating gate MOS memory element, in which the drain voltage is 7 volts. A writing operation is possible when the drain voltage exceeds 4 volts.

An erasing operation can be achieved by a voltage (for example, 14 volts) which is higher than a voltage for writing operation being supplied between the source region 14 and the drain region 11. Generally, a current generated in the depletion layer by impact ionization through collision of electron hole pairs becomes greater than a dark (saturation) current when a high reverse bias voltage is applied across a pn junction.

Generally, a multiplication coefficient M is described follows:

$$M = 1/[1-(V/V_b)^n] \quad (1)$$

where $V_b$ is breakdown voltage, and n is an intrinsic factor of the material. When the multiplication coefficient M is infinity, the element is in breakdown.

Generally, the breakdown characteristic of the MOS transistor depend on the gate voltage. For example, the breakdown voltage of an n-type MOS transistor decreases with the gate voltage, because the intensity of the electric field in the depletion layer of the pn junction in the vicinity of the drain region depends on the gate voltage.

Figure 7:
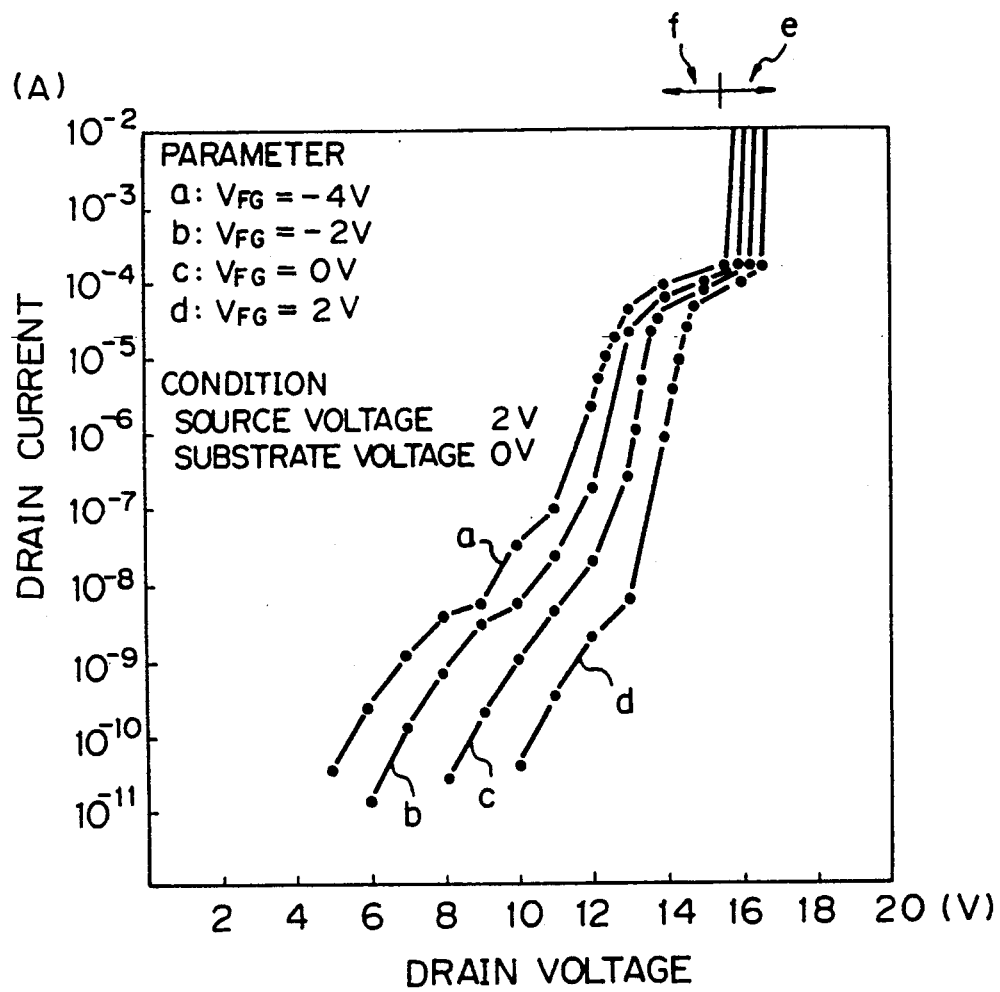
FIG. 7 is a graph showing variations in drain current with drain voltage of a MOS memory element subjected to an erasing operation.

FIG. 7 shows the variation in the drain current versus the drain voltage in a floating gate MOS transistor as a parameter of the potential of the floating gate. In FIG. 7, the potential of the silicon substrate is a ground potential (0 volt), the potential of the source region is 2 volts, and the potential of the floating gate is in the range of 2 to −4 volts. In FIG. 7, an arrow e indicates a breakdown region and an arrow f indicates a region before the generation of breakdown. When the drain voltage is in the range of 10 to 15 volts, the drain current increases sharply with the drain voltage. The drain current depends on the floating gate voltage. This fact shows that the quantity of excess electrons injected into the floating gate and the junction current between the drain region and the substrate are in correlation. When excess electrons are injected into the floating gate, the junction current, i.e., the drain current, is on the order of 100 μA. When the quantity of electrons injected into the floating gate is small, the drain voltage causes a junction current on the order of several microamperes. The junction current depletes (erases) the excess electrons in the floating gate.

Figure 8:
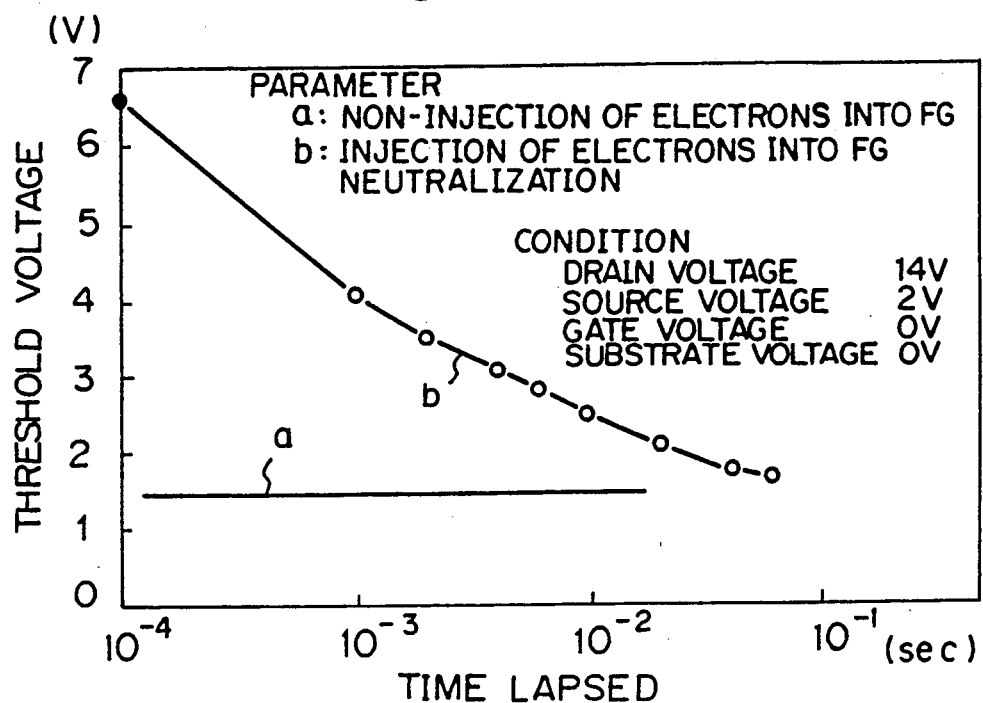
FIG. 8 is a graph showing variations in the threshold voltage of a MOS memory element with time after a writing operation.

FIG. 8 is a graph obtained through experiments showing the variations of the threshold voltage of a floating gate MOS transistor with respect to time after a writing operation. In FIG. 8, the voltage of the drain region is 14 volts, the voltage of the source region is 2 volts and the voltages of the substrate and the control gate are 0 volts. In FIG. 8, a line a indicates the variations in the threshold voltage when no electrons are injected into the floating gate, and a curve b indicates the variations in the threshold voltage when electrons are injected into the floating gate. A voltage of 2 volts is applied to the source region to prevent the flow of a large quantity of electrons into the substrate due to the junction current increasing the potential of the substrate below the gate electrode bringing the pn-junction between the substrate and the source region into the state of forward bias. The electrons generate the multiplication of new carriers in the depletion layer in the vicinity of the drain region so as to reduce the breakdown withstanding voltage of the drain region, whereby the margin of the drain voltage for an erasing operation is reduced.

Figure 9:
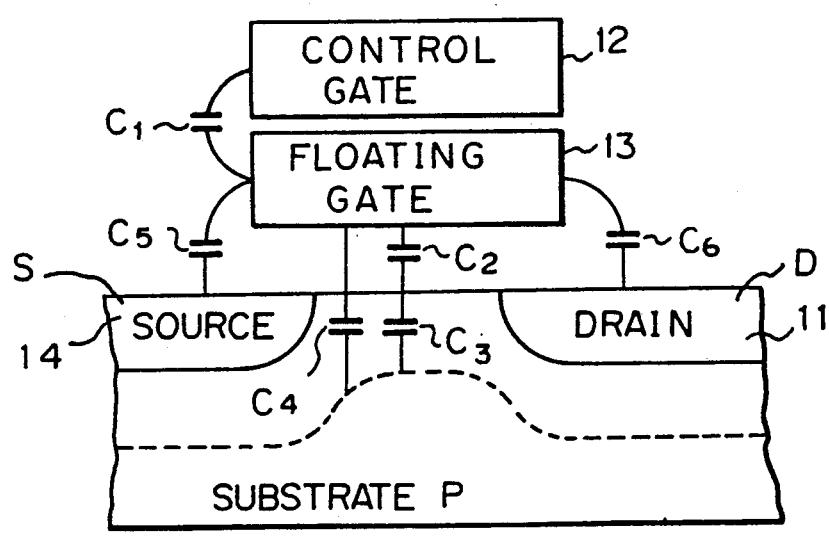
FIG. 9 is a diagram of a MOS memory element showing the distribution of parasitic capacitance.

FIG. 9 is an equivalent diagram of a MOS memory element, showing the distribution of parasitic capacitance between the floating gate and other regions. In FIG. 9, C1 is a capacitance between the floating gate 13 and the control gate 12; C2 is a capacitance between the floating gate 13 and the channel region; C3 is a capacitance between the channel region and the substrate; C4 is a combined capacitance of the capacitances C2 and C3, and C5 is a capacitance between the floating gate 13 and the source region 14. C6 is a capacitance between the floating gate 13 and the drain 11. The quantity of electric charge accumulated in the floating gate of the MOS memory element depends mainly on the capacitance C4 when the voltage of the floating gate is lower than the threshold voltage, and depends mainly on the capacitance C2 when the voltage of the floating gate is higher than the threshold voltage. The relationship among the capacitances shown in FIG. 9 is described generally by:

$$C1/(C1+C2+C5+C6)=0.6 \qquad (2)$$

The threshold voltage of the MOS memory element in a writing state necessary for reading operation is equivalent to a supply voltage, for example, on the order of 5 volts. Since the initial threshold voltage of the MOS memory element is 1.5 volts as shown in FIG. 6, the threshold voltage increases by 3.5 volts after a writing operation. In this case, the injected electric charge is accumulated in the capacitance C1. From the equation (2), the potential of the floating gate of the MOS memory element in which the threshold voltage varies by 3.5 volts is:

$$-3.5V \times 0.6 = -2.1V \qquad (3)$$

when the control gate, the source region and the drain region are all maintained at a ground potential.

The potential of the floating gate of the MOS memory element is 0 volts before a writing operation. When the respective potentials of the drain region and source region of the MOS memory element increase, the potential of the floating gate increases by the capacitances C5 and C6. The potential of the floating gate under such bias conditions is, as shown in FIG. 8, −2 volts during a writing operation and approximately 1.5 volts during an erasing operation.

As shown in FIG. 7, since the drain current necessary for erasing data stored in one MOS memory element is on the order of 100 μA at the maximum, data stored in the plurality of MOS memory elements of a memory array can simultaneously be erased by means of an internal or external power circuit.

As is apparent from the foregoing description, as the junction current is generated in accordance with the increase of the drain voltage, the drain current decreases gradually with the progress of an erasing operation. Accordingly, the data stored in the MOS memory element can be perfectly erased by maintaining the erasing current at a fixed level during an erasing operation by controlling the increasing rate of the drain voltage. Such an erasing operation can easily be achieved by applying a voltage through a current limiting resistance to the drain region.

An EEPROM, in a first embodiment, according to the present invention will be described hereinafter with reference to FIG. 1.

Figure 1:
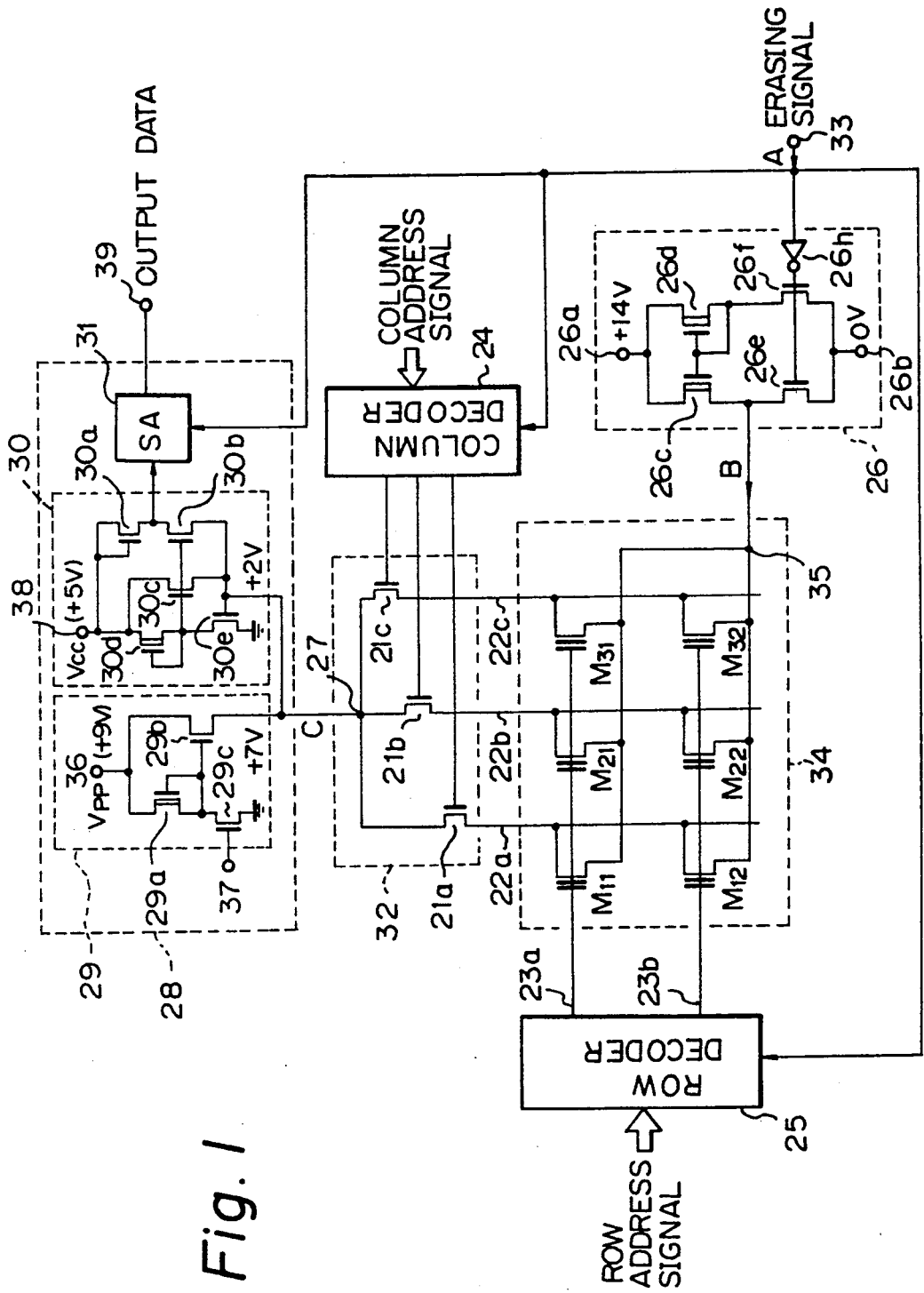
FIG. 1 is a circuit diagram of an EEPROM, in a preferred embodiment, according to the present invention.

Referring to FIG. 1, the EEPROM comprises a memory array 34 consisting of a plurality of floating gate MOS memory elements, a switching circuit 32, a column decoder 24, a row decoder 25, a voltage switching circuit 26 and a reading-writing circuit 28.

The memory array 34 consists of a plurality of floating gate MOS memory elements M11, M12, M21, M22, M31 and M32 arranged in a 2×3 matrix. The respective drain electrodes of the MOS memory elements are connected to the output terminal of the voltage switching circuit 26. The respective gate electrodes and source electrodes of the MOS memory elements are connected respectively to word lines 23 (23a and 23b) and data lines 22 (22a, 22b and 22c).

The switching circuit 32 consists of MOS transistors 21 (21a, 21b and 21c) connected respectively to the data lines.

The row decoder 25 selects one of the word lines 23 of the memory array 34 according to row address data during a reading/writing operation. When an erasing signal A is supplied for an erasing operation, the row decoder 25 connects all the word lines to a ground.

The column decoder 24 turns on one of the MOS transistors 21 in the switching circuit 32 according to a column address data during a reading/writing operation to select one of the data lines 22 of the memory array 34. When the erasing signal A is supplied for an erasing operation, the column decoder 24 turns on all the MOS transistors 21a, 21b and 21c to connect all the data lines to a node 27.

The voltage switching circuit 26 is connected to the node 35 of the memory array 34. When the erasing signal A is supplied to the terminal 33, the voltage switching circuit 26 provides either a ground voltage or an erasing voltage (for example, 14 volts) depending on the level of the erasing signal A. The voltage switching circuit 26 consists of, for example, of depletion-type MOSFETs 26c and 26d, enhancement-type MOSFETs 26e and 26f, and an MOS inverter 26h.

The reading-writing circuit 28 consists of a writing control circuit 29, a reading circuit 30 and a sense amplifier 31. During reading/writing operation, the reading-writing circuit 28 selectively applies a writing signal to the node 27 of the switching circuit 32 or applies information from the selected memory cell through the node 27 to an output terminal 39. During erasing operation, the reading-writing circuit 28 applies a voltage of approximately 2 volts to the node 27.

The writing control circuit 29 consists of a depletion-type load MOS transistor 29a, an enhancement-type MOS transistor 29c which receives a writing control signal and an enhancement-type MOS transistor 29b which selectively applies a high voltage Vpp (for example, +9 volts) to the node 27. Since the high voltage Vpp is reduced by the MOS transistor 29b, the actual potential of the node 27 is +7 volts.

The reading circuit 30 consists of enhancement-type MOS transistors 30a, 30b, 30c and 30e and a depletion-type MOS transistor 30d. The reading circuit 30 applies a low voltage (for example, +2 volts) to the node 27.

In reading operation, the sense amplifier 31 applies a reading signal provided by the reading circuit 30 to the data output terminal 39. The sense amplifier 31 is disabled by the erasing signal A.

The column decoder 24, the row decoder 25 and the sense amplifier 31 are set for an erasing mode by the erasing signal A.

Figure 2:
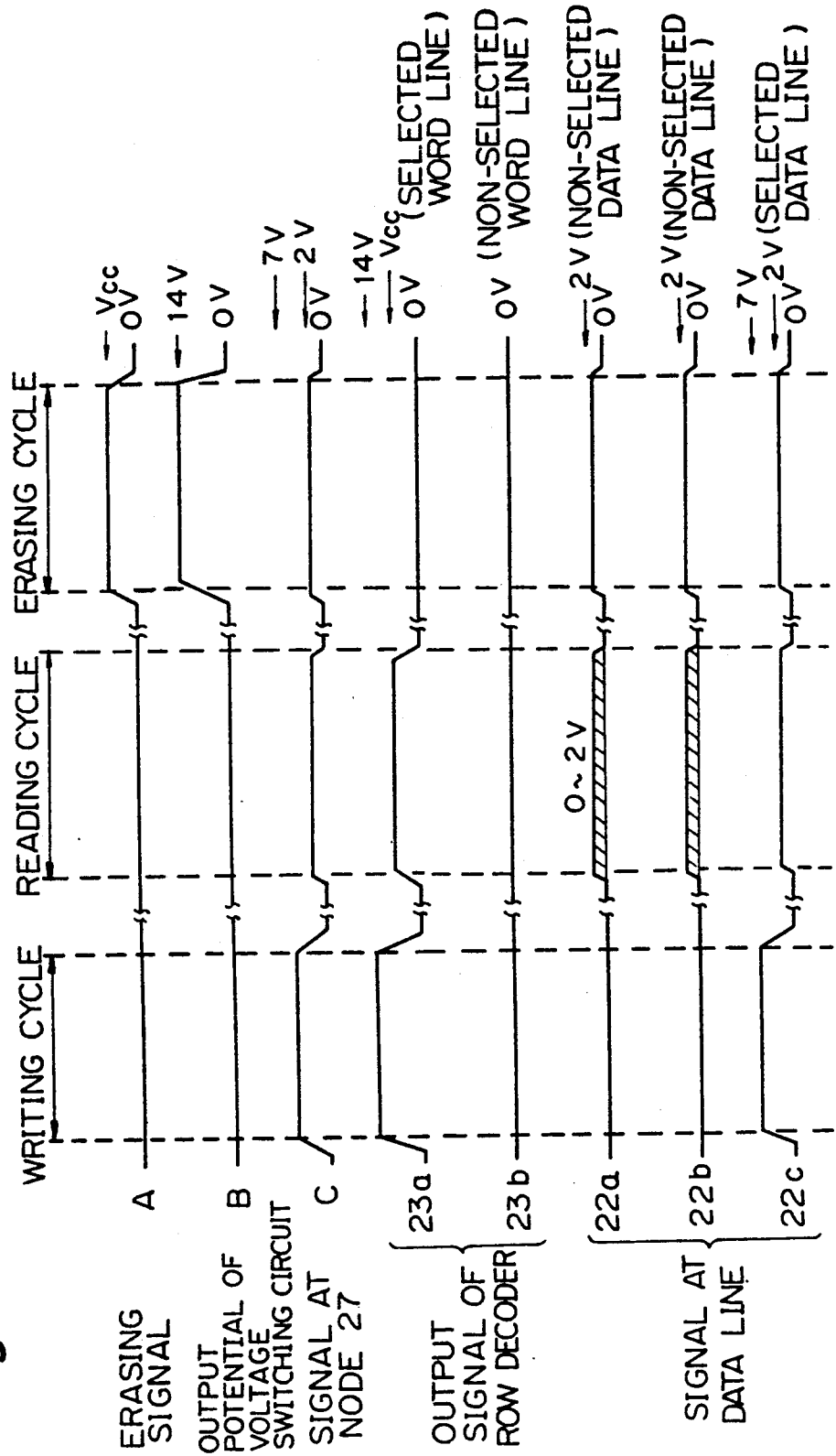
FIG. 2 is a time chart showing waveforms of signals transferred in the EEPROM, of FIG. 1.

The operation of the EEPROM of FIG. 1 will be described hereinafter with reference to FIG. 2.

In a writing cycle, the erasing signal A is LOW and the output potential B of the voltage switching circuit 26 is LOW (0 volts). When a LOW writing control signal is applied to the input terminal 37 of the writing control circuit 29, the writing control circuit 29 applies a high voltage (for example, +7 volts) to the node 27.

Then, the row decoder 25 selects, for example, the word line 23a according to a row address signal, and applies a voltage of 14 volts to the control gates of the memory elements M11, M21 and M31. The column decoder 24 selectively turns on, for example, the transistor 21c according to a column address signal to apply a voltage of +7 volts to the drain electrodes of the memory elements M31 and M32. Consequently, electrons are injected into the floating gate of the memory element M31, whereby a writing operation is executed.

In a reading cycle, the erasing signal A is LOW, the output potential B of the voltage switching circuit 26 is LOW (0 volts), and the reading circuit 30 applies a voltage of approximately 2 volts to the node 27.

The row decoder 25 selects, for example, the word line 23a according to a row address signal and applies a voltage (Vcc) of approximately 5 volts to the control gates of the memory elements M11, M21 and M31. The column decoder 24 turns on, for example, the transistor 21c according to a column address signal to apply a voltage of approximately +2 volts to the drains of the memory elements M31 and M32 connected to the data line 22c. Consequently, data stored in the memory element M31 is applied to the reading circuit 30 and is applied through the sense amplifier 31 to the output terminal 39.

In an erasing cycle, a HIGH erasing signal A (Vcc) is applied to the terminal 33. Then, the voltage switching circuit 27 provides the output potential B of approximately 14 volts through the node 35 to the source electrodes of all of the memory elements of the memory array 34. The reading-writing circuit 28 applies a voltage of approximately 2 volts to the node 27. The row decoder 25 applies a voltage of 0 volts to all the word lines 23a, 23b in response to the erasing signal A. The column decoder 24 turns on the switching transistors 21a, 21b and 21c in response to the erasing signal A to apply a voltage of approximately +2 volts to the drain electrodes of all of the memory elements of the memory array 34. Consequently, all of data stored in all of the memory elements of the memory array 34 are erased.

Breakdown occurs temporarily in the memory element having a floating gate into which a large quantity of electrons is injected. However, the temporary breakdown stops automatically upon the disappearance of the negative electric charge of the floating gate. When a negative electric charge is stored in the floating gate of the MOS memory element, the negative electric charge of the floating gate of the MOS memory element disappears in an appropriate time under the conditions for an erasing operation, and hence the threshold voltage is initialized (refer to FIG. 8). When no negative electric charge is stored in the floating gate of the MOS memory element, the variation of the quantity of electric charge in the floating gate is negligibly small because the junction current is minute, and hence the variation of the threshold voltage $V_T$ of the MOS memory element is small (refer to FIG. 8).

The termination of an erasing operation can be detected by detecting the drain current, namely, a current supplied by the voltage switching circuit 26.

When the EEPROM is provided with a plurality of voltage switching circuits 26, the memory array 34 can be divided into groups of MOS memory elements and the data stored in the MOS memory elements of each group of the memory array can be erased by a small current.

An EEPROM, in a second embodiment, according to the present invention will be described with reference to FIG. 10, in which parts similar to those previously described with reference to FIG. 1 are denoted by the same reference characters.

In an erasing operation, a reading-writing circuit 44 applies a voltage (for example, 14 volts) which is higher than a voltage (for example, 7 volts) for a writing operation to data lines.

In a reading-writing operation, a LOW erasing signal is applied to a terminal 33, and hence the MOS transistor 43 is ON. Accordingly, the potential of a node 35 is equal to a ground potential.

In response to an erasing signal, a column decoder 41 turns on one of the MOS transistors 21a, 21b and 21c of a circuit 32 to connect a node 27 to at least one of the data lines 22a, 22b, and 22c.

In an erasing operation, a reading-writing circuit 44 applies a high voltage (14 volts) to the node 27 when a HIGH erasing signal is applied to the terminal 33. At the same time, the column decoder 41 turns on the MOS transistor 21c to connect the node 27 to the data line 22c. In response to the erasing signal, a row decoder 25 sets all of the word lines 23a and 23b to a ground potential. Since the MOS transistor 43 is OFF, the voltage of the node 35 is 0 volts in the initial stage of an erasing operation. The voltage of the node 35 increases to approximately 2 volts due to the breakdown of the memory element and a tailing current. Accordingly, the data stored in the selected MOS memory elements M31 and M32 is erased. The column decoder 41 may be designed so as to turn on all of the MOS transistors 21a, 21b and 21c of the switching circuit 32 simultaneously in response to an erasing signal. The potential of the node 35 is maintained at approximately 2 volts by a diode-connected MOS transistor 42. Cascade diode-connected MOS transistors 42 may be used as a constant voltage means.

Similarly in a fashion similar to the first embodiment, a bias voltage is applied to the MOS memory elements in a reading-writing operation.

Figure 3:
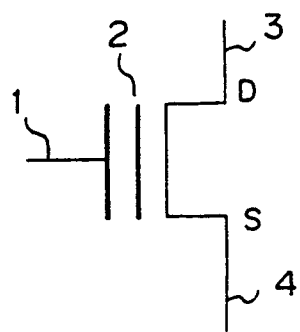
FIG. 3 is a diagram showing an equivalent circuit of a floating gate MOS memory element employed in the EEPROM of FIG. 1.
Figure 10:
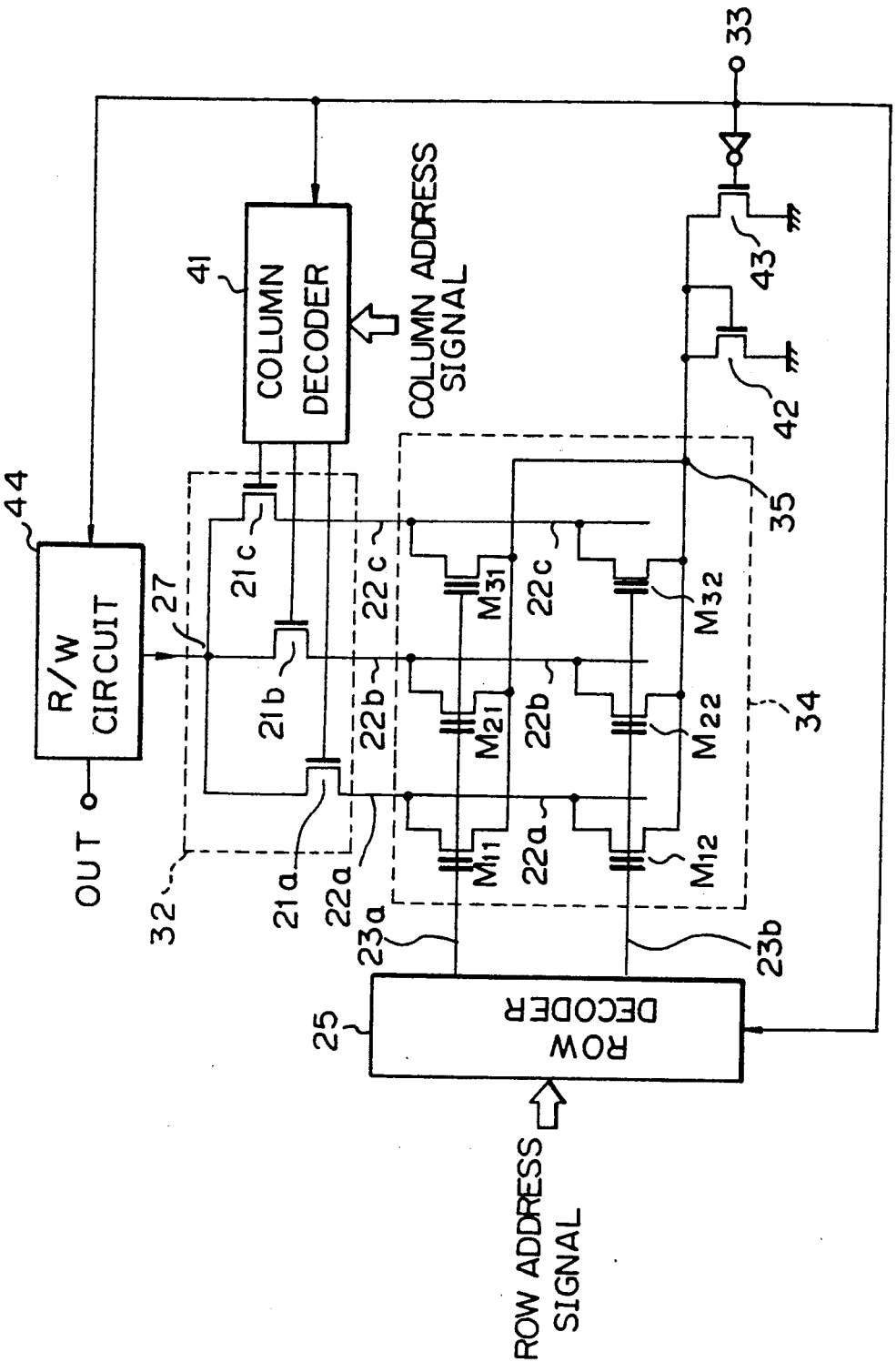
FIG. 10 is a circuit diagram of an EEPROM, in the second embodiment according to the present invention.

In the EEPROM shown in FIG. 10, when the floating gate MOS transistors each having a single control electrode as shown in FIG. 3 are employed as memory elements, it is necessary to prevent the slight erasing operation of the memory elements having accumulated electric charge which are not selected in a writing operation.

As shown in FIG. 7, when voltages of −4 volts and 7 volts are applied respectively to the floating gate and the drain, the junction current is $10^{-8}$ A or lower, which is very small as compared with the substantial erasing current in the range of several microamperes to several tens of microamperes. Accordingly, there is no possibility that the data stored in the memory elements not selected is erased.

An EEPROM, in a third embodiment, according to the present invention will be described hereinafter with reference to FIG. 11.

Figure 11:
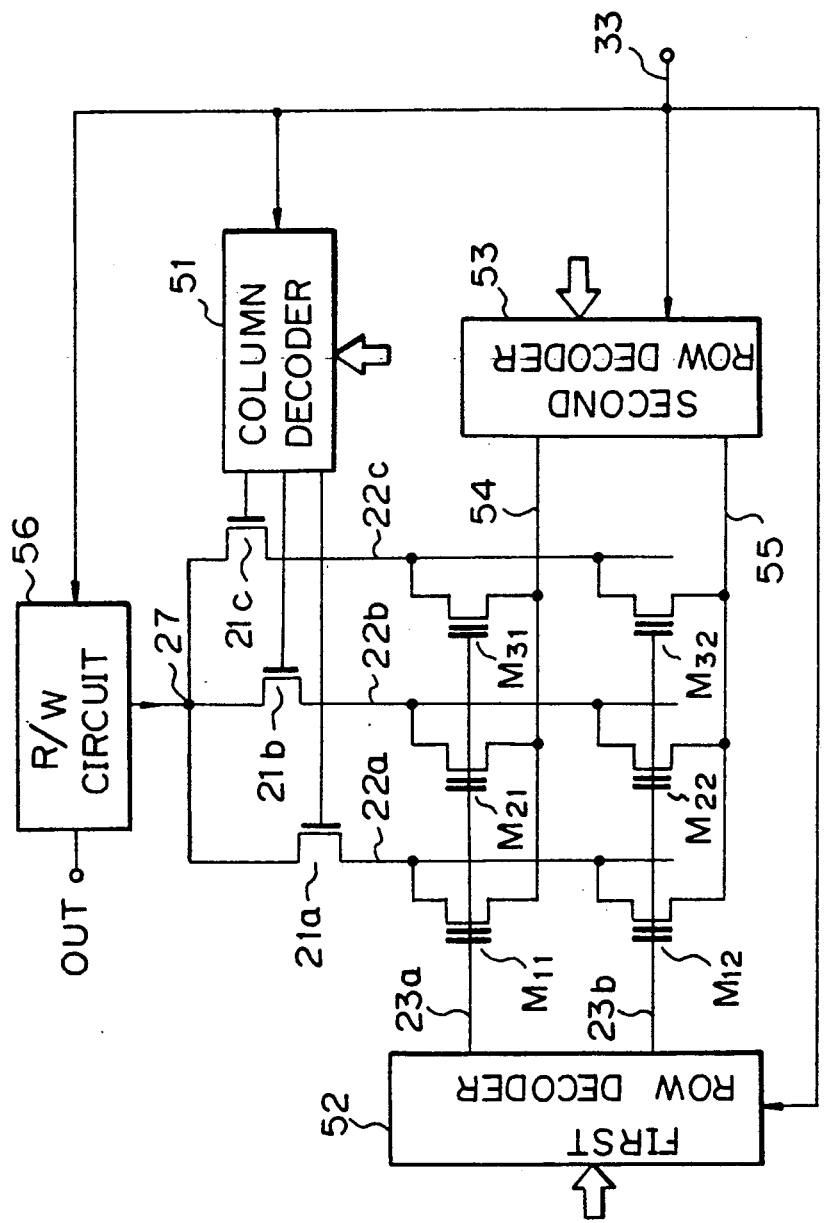
FIG. 11 is a circuit diagram of an EEPROM, in the third embodiment, according to the present invention.
Figure 12:
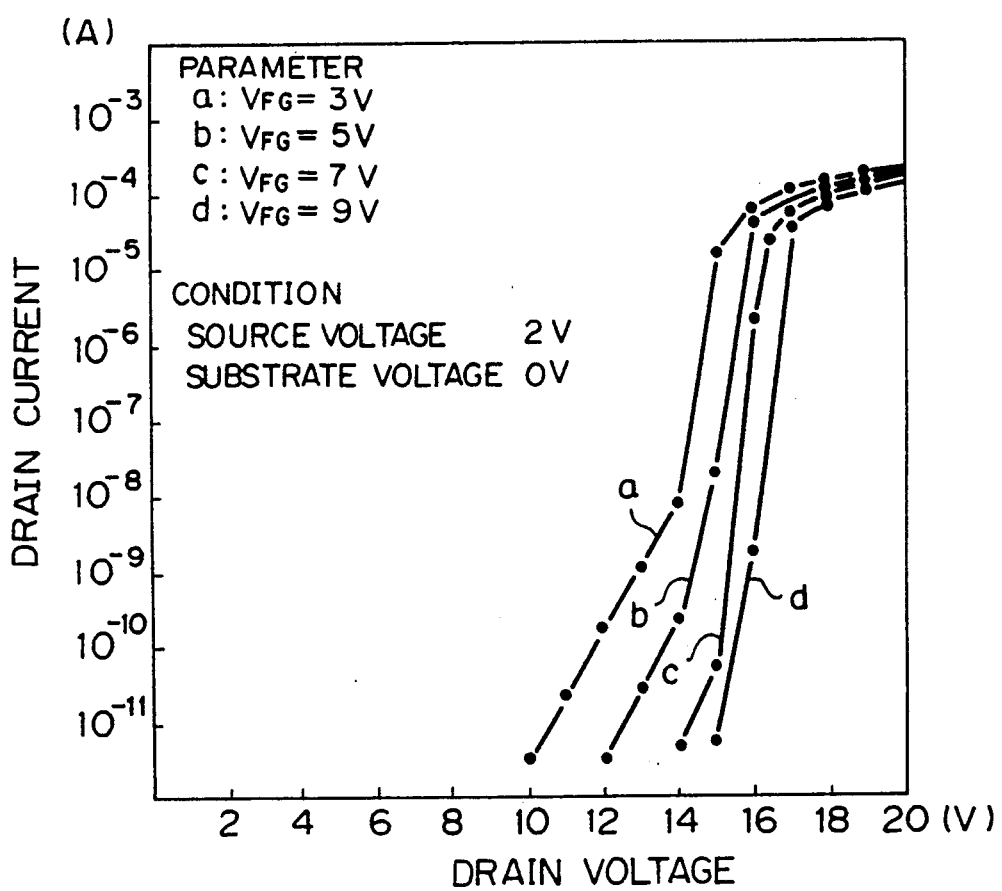
FIG. 12 is a graph showing variations in drain current with drain voltage of a MOS memory element in FIG. 11 of which data is not erased during an erasing operation.

Referring to FIG. 11, in a reading-writing operation, a first row decoder 52 selects one word line, applies a high voltage (14 volts) or a voltage Vcc (5 volts) to the selected word line and keeps the rest of the word lines at 0 volts, while a second row decoder 53 keeps all the signal lines 54 and 55 at a ground potential (0 volt).

In an erasing operation, the second row decoder 53 selects either the signal line 54 or 55, applies a voltage of .2 volts to the selected signal line and applies a voltage of 9 volts to the other signal line. A column decoder 51 selects one of the switching transistors 21 and turns on the selected switching transistor 21 to connect a node 27 to data lines.

In a reading operation, a reading-writing circuit 56 applies a voltage of 2 volts to the node 27 and detects a current that flows through the node 27. In a writing operation, the reading-writing circuit 56 applies a voltage of 7 volts or 0 volts to the node 27 according to writing data, and applies a voltage of 14 volts to the node 27 in an erasing operation. In writing data, for example, in a memory element M21, the column decoder 51 turns on a transistor 21b to apply a voltage of 7 volts through a data line 22b to the drain of the memory element M21. The first row decoder 52 applies voltages of 14 volts and 0 volts respectively to word lines 23a and 23b. The second row decoder 53 applies a voltage of 0 volts to signal lines 54 and 55. Thus, electrons are injected into the floating gate of the memory element M21.

In erasing data stored in the memory element M21, the column decoder 51 turns on the transistor 21b to connect the node 27 (14 volts) to a data line 22b. The first row decoder 52 selects and applies a voltage of 0 volts to a word line 23a, and applies a high voltage (9 volts) to a word line 23b. The second row decoder 53 applies voltages of 2 volts and 9 volts respectively to the signal lines 54 and 55. Although the data lines 22a and 22c are charged through the memory elements M12 and M32 and the signal line 55, the voltage of the data lines 22a and 22c remains 7 volts or below because the threshold voltage of the memory elements is high. Since the potentials of the control gate, drain and source of the memory element M21 are 0 volts, 14 volts and 2 volts, respectively, data stored in the memory element M21 are erased. Since the drain voltage of memory elements M11 and M31 connected to the word line 23a, which has not been selected, is 7 volts or below, data stored in the memory elements M11 and M31 are not erased. Since the voltages of the control gates, sources and drains of memory elements M12 and M32 connected to the word line 23b, which have not been selected, are 9 volts and 7 volts, respectively, data stored in the memory elements M12 and M32 are not erased. Since the voltages of the control gate, source and drain of a memory element M22 connected to the word line 23b, which have not been selected, are 9 volts, 9 volts and 14 volts, data stored in the memory element M22 are not erased. That is, since the voltages of the floating gates of MOS memory elements connected to the word line 23b, which have not been selected, are maintained at a voltage of 3 volts or above even during a writing operation and the drain current is $10^{-8}$ A or below, data stored in the MOS memory elements are not erased.

The third embodiment enables individual data erasing for every bit or every byte. In the EEPROM in the third embodiment, electrons accumulated in the floating gates of the memory elements decreases gradually as writing operations and erasing operations are repeated. However, data loss can easily be prevented by providing the EEPROM with a circuit for periodically refreshing data. It is also possible to provide the EEPROM with an erasing operation counter for counting the frequency of erasing operations to determine an effective refresh period.

Although the invention has been described in its preferred form with a certain degree of particularity, it is to be understood that many variations and changes are possible in the invention without departing from the scope thereof.

What is claimed is:

1. An electrically erasable programmable read only memory device comprising:
   (a) a semiconductor substrate;
   (b) a memory matrix array formed on said semiconductor substrate, comprising a plurality of MOS memory elements, each having a floating gate, and a plurality of word lines arranged in rows and a plurality of data lines arranged in columns, each of said word lines being associated with a plurality of MOS memory elements, and each of said data lines being associated with a plurality of MOS memory elements, and each of said MOS memory elements having a control gate electrode connected to an associated word line, a first region connected to an associated data line and a second region connected to a third line;
   (c) a word line decoder connected to said plurality of word lines for selecting one of said word lines and for applying a first voltage to the control gate electrode of a selected MOS memory element connected to the selected word lines during an erasing operation;
   (d) a switching circuit connected to said data lines for providing a second voltage to a selected one of said data lines to generate an avalanche current which flows from a first region of the selected MOS memory element toward said substrate, thus performing an erasing operation by neutralizing electric charges of a floating gate of the selected MOS memory element, said second voltage being slightly smaller than a breakdown voltage of the selected MOS memory element;
   (e) a reading and writing circuit connected to said switching circuit for providing said second voltage to said switching circuit; and
   (f) a means connected to said third line for providing a third voltage to said second region of said selected MOS memory element which is higher than a substrate voltage generated due to the avalanche current flowing from the first region of said selected MOS memory element toward said substrate so as to suppress a breakdown effect of said selected MOS memory element during an erasing operation.

2. A device according to claim 1, wherein said means for providing said third voltage comprises enhancement MOS transistors, and wherein said third voltage is provided in response to an erasing control signal applied to said enhancement MOS transistors.

3. An electrically erasable programmable read only memory device comprising:
   (a) a semiconductor substrate;
   (b) a memory matrix array formed on said semiconductor substrate, comprising a plurality of MOS memory elements, each having a floating gate, and a plurality of word lines arranged in rows and a plurality of data lines arranged in columns, and a plurality of third lines, each of said word lines being associated with a plurality of MOS memory elements, and each of said MOS memory elements having a control gate electrode connected to an associated word line, a first region connected to an associated data line and a second region connected to a third line;
   (c) a first row decoder connected to said word lines for selecting one of said word lines and for applying a first voltage to the selected word line and to a control gate electrode of a selected MOS memory element associated with the selected word line during an erasing operation;

(d) a switching circuit connected to said data lines for providing a second voltage to a selected data line selected from said data lines and to a first region of said selected MOS memory element associated with the selected data line to generate an avalanche current which flows from the first region of said selected MOS memory element toward said substrate, thus performing an erasing operation by neutralizing electric charges of said floating gate of said selected MOS memory element, said second voltage slightly smaller than a breakdown voltage of said selected MOS memory element;

(e) a reading and writing circuit connected to said switching circuit for providing said second voltage to said switching circuit; and (f) a second row decoder, connected to said third lines, for selecting one of said third lines and for applying a third voltage thereto in response to an erasing signal, wherein said third voltage is higher than a substrate voltage generated due to an avalanche current flowing from the first region of said selected MOS memory element toward said substrate so as to suppress a breakdown effect during an erasing operation.

4. An electrically erasable programmable read only memory device comprising:

(a) a semiconductor substrate;

(b) a memory matrix array formed on said semiconductor substrate, comprising a plurality of MOS memory elements, each having a floating gate, said MOS memory elements being arranged in rows and columns, word lines and data lines, each of said MOS memory elements having a control gate electrode connected to an associated word line, a first region formed in a portion of said substrate and connected to an associated data line and a second region formed in another portion of said substrate and connected to a third line;

(c) a first means connected to at least one of said word lines for applying a first voltage which prevents the formation of a channel region between said first and second regions of each MOS memory element which is supplied with the first voltage through a word line connected to said first means;

(d) a second means connected to a selected data line which is connected to a first region of a selected MOS memory element selected from said MOS memory elements for providing a second voltage to said selected data line to generate an avalanche current which flows from said first region of said selected MOS memory element toward said substrate, thus performing an erasing operation by neutralizing electric charges of said floating gate of said selected MOS memory element voltage being slightly smaller than a breakdown voltage of said selected MOS memory element; and (e) a third means connected to a third line connected to a second region of said selected MOS memory element for providing a third voltage to said second region of said selected MOS memory element which is higher than a substrate voltage generated due to the avalanche current flowing from said first region of said selected MOS memory element toward said substrate so as to suppress a breakdown effect during an erasing operation.

5. An electrically erasable programmable read only memory device comprising:

(a) a semiconductor substrate;

(b) a memory matrix array formed on said semiconductor substrate, comprising a plurality of word lines arranged in rows, a plurality of data lines arranged in columns, a plurality of third lines, and a plurality of MOS memory elements, each of said MOS memory elements having a floating gate, a control gate electrode connected to an associated word line, a first region connected to an associated data line and a second region connected to an associated third line;

(c) a first row decoder connected to said word lines for selecting one of said word lines and for supplying a first voltage to the selected word line and to the control gate electrode of a selected MOS memory element selected from said MOS memory elements associated with the selected word line during an erasing operation;

(d) a switching circuit connected to said data lines for providing a second voltage to a selected data line selected from said data lines so as to perform an erasing operation by neutralizing electric charges of a floating gate of the selected MOS memory element connected to the selected data line, said second voltage being slightly smaller than a breakdown voltage of the selected MOS memory element;

(e) a reading and writing circuit connected to said switching circuit for providing said second voltage to said switching circuit; and (f) a second row decoder connected to said third lines for selecting one of said third lines and for applying a third voltage thereto in response to an erasing signal so that one MOS memory element is selected, wherein said third voltage is higher than a substrate voltage generated due to an avalanche current flowing from the first region of said selected MOS memory element toward said substrate so as to suppress a breakdown effect during an erasing operation.

6. An electrically erasable programmable read only memory device comprising:

(a) a semiconductor substrate;

(b) a MOS memory element formed on said semiconductor substrate, said MOS memory element having a floating gate, a control gate electrode, a first region formed in a part of said substrate, and a second region formed in another part of said substrate;

(c) a first line connected to said control gate electrode of said MOS memory element;

(d) a second line connected to said first region of said MOS memory element;

(e) a third line connected to said second region of said MOS memory element;

(f) a first means connected to said first line for supplying a first voltage to said control gate electrode so as to prevent the formation of a channel region between said first and second regions;

(g) a second means connected to said second line for providing a second voltage to said first region so as to allow an avalanche current to flow between said first region and said substrate and to prevent the flow of a channel current between said first region and second region, thus performing an erasing operation by neutralizing electric changes of said floating gate, wherein said second voltage is slightly smaller than a breakdown voltage of said MOS memory element;

(h) a third means connected to said third line for providing a third voltage to said second region, wherein said third voltage is higher than a substrate voltage generated due to the avalanche current so as to suppress a breakdown effect during an erasing operation.

7. A device according to claim 6, wherein said first voltage, second voltage and third voltage are provided in response to an erasing control signal which is inputted to said first means, second means and third means.

* * * * *